United States Patent [19]

Ogawa

[11] Patent Number: 4,977,335
[45] Date of Patent: Dec. 11, 1990

[54] LOW DRIVING VOLTAGE OPERATION LOGIC CIRCUIT

[75] Inventor: Atsusi Ogawa, Kanagawa, Japan

[73] Assignee: Kabushiki Kaisha Toshiba, Kanagawa, Japan

[21] Appl. No.: 375,615

[22] Filed: Jul. 5, 1989

[30] Foreign Application Priority Data

Jul. 11, 1988 [JP] Japan .................. 63-172263

[51] Int. Cl.$^5$ ............................. H03K 3/289
[52] U.S. Cl. .................. 307/272.2; 307/455; 307/296.3
[58] Field of Search ............ 307/272.2, 455, 296.3, 307/529

[56] References Cited

U.S. PATENT DOCUMENTS

| 3,728,560 | 4/1973 | Treadway | 307/272.2 |
| 3,728,561 | 4/1973 | Brocker, Jr. | 307/272.2 |
| 4,276,488 | 6/1981 | Benedict et al. | 307/455 |
| 4,349,753 | 9/1982 | Scavuzzo | 307/455 |
| 4,357,547 | 11/1982 | Espe et al. | 307/455 |
| 4,528,465 | 7/1985 | Harvey | 307/455 |
| 4,578,599 | 3/1986 | Birch et al. | 307/272.2 |

FOREIGN PATENT DOCUMENTS

| 4511764 | 12/1966 | Japan . | |
| 0177811 | 8/1986 | Japan | 307/272.2 |

OTHER PUBLICATIONS

Plessey Semiconductor IC DATABOOK, pp. 175, 179, dated Nov. 1974, Figure 2 on p. 175 discloses and ECL Type Dual 4-Input OR/NOR Gate Circuit, Figure 2 on p. 179 discloses an ECL Type Quad 2-Input NOR Gate Circuit.

Primary Examiner—Stanley D. Miller
Assistant Examiner—T. Cunningham
Attorney, Agent, or Firm—Finnegan, Henderson, Farabow, Garrett & Dunner

[57] ABSTRACT

A low driving voltage operation logic circuit responsive to a power source voltage applied between a pair of power source terminals for modifying an input signal according to a predetermined logic pattern. The logic circuit includes an input control circuit having a plurality of input transistors for generating a pair of control signals, each having a level opposite to the other, in response to the input signal and a differential circuit having a plurality of paired transistors for dividing the frequency of the control signals, the input transistors each having an emitter area substantially larger than the emitter area of each paired transistor and the logic circuit including only a single base to emitter junction corresponding to each input transistor between the power source terminals.

6 Claims, 6 Drawing Sheets

LOW DRIVING VOLTAGE OPERATION LOGIC CIRCUIT

FIELD OF THE INVENTION

The present invention relates to a logic circuit, and more particularly to a master-slave type flip-flop logic circuit operable at a low driving voltage.

BACKGROUND OF THE INVENTION

A conventional logic circuit employing bipolar transistors is shown in FIG. 1. In FIG. 1, an input signal which changes between two logic states, i.e., the high level state (referred as H level hereafter) and the low level state (referred as L level hereafter) is applied to an input terminal 10. This input signal is applied to the base of a transistor 12 of a first differential amplifier circuit 14 through a capacitor 16. A resistor 18 is connected between the base of the transistor 12 an a power supply terminal 20 with a source voltage Vcc. The first differential amplifier circuit 14 comprises the transistor 12 and a transistor 22, whose emitters are connected with each other.

Load resistors 24 and 26 are connected between the collectors of the transistors 12 and 22 and the power supply terminal 20, respectively. The connection node between the emitters of the transistors 12 and 22 is connected to a reference potential supply terminal 28 via a current source 30. Two transistors 32 and 34 are coupled in parallel between the power supply terminal 20 and the reference potential supply terminal 28 through current sources 36 and 38, respectively. The bases of the transistors 32 and 34 are connected to the collectors of the transistors 12 and 22. Thus, potentials on the collectors of the transistors 12 and 22 are led to the bases of transistors 32 and 34. Thus, currents supplied from current sources 36 and 38 to the transistors 32 and 34 are differentially controlled by the transistors 12 and 22, respectively.

Transistors 40, 42, 44, 46, 48, 50, 52, 54, 46, 58, 60 and 62 constitute a master-slave flip-flop 64 in a type of a double-balance type differential circuit. The transistors 40, 42, 44, 46, 48, 50, 52, 54, 56, 58, 60 and 62 constitute six differential circuits 66, 68, 70, 72, 74 and 76. The transistors 40 and 42 constitute a second differential circuit 66. The transistors 44 and 46 constitute a third differential circuit 68. The transistors 48 and 50 constitute a fourth differential circuit 70. The transistors 52 and 54 constitute a fifth differential circuit 72. The transistors 56 and 58 constitute a sixth differential circuit 74. The transistors 60 and 62 constitute a seventh differential circuit 76. That is, the emitters of the transistors 40 and 42 are connected in common and then the common emitter connection node thereof is coupled to the collector of the transistor 56. The emitters of the transistors 44 and 46 are connected in common and then the common emitter connection node thereof is coupled to the collector of the transistor 58. The emitters of the transistors 48 and 50 are connected in common and then the common emitter connection node thereof is coupled to the collector of the transistor 60. The emitters of the transistors 52 and 54 are connected in common and then the common emitter connection node thereof is coupled to the collector of the transistor 62. The emitters of the transistors 56 and 58 are connected in common and then the common emitter connection node thereof is coupled to the reference potential supply terminal 28 through a current source 78. The emitters of the transistors 60 and 62 are connected in common and then the common emitter connection node thereof is coupled to the reference potential supply terminal 28 through a current source 80.

The transistors 56 and 58 in the sixth differential circuit 74 differentially drive the transistors 40, 42, 44 and 46. The transistors 60 and 62 in the seventh differential circuit 76 differentially drive transistors 48, 50, 52 and 54.

The bases of the transistors 56 and 62 are connected to each other. Similarly, the bases of the transistors 58 and 60 are connected to each other. Thus, the current source 78 supplies a current controlled by the input signal to the input terminal 10. The current source 80 supplies a current controlled by the same input signal.

The collectors of the transistors 40 and 44 are commonly connected to the power supply terminal 20 through a load resistor 82. The collectors of the transistors 42 and 46 are commonly connected to the power supply terminal 20 through a load resistor 84. The collectors of the transistors 48 and 52 are commonly connected to the power supply terminal 20 through a load resistor 86. The collectors of the transistors 50 and 54 are commonly connected to the power supply terminal 20 through a load resistor 88.

The common collector connector node 90 of the transistor 40 and 44 is connected to the bases of the transistors 42 and 52. The common collector connection node 92 of the transistors 42 and 46 is connected to the bases of the transistors 40 and 54. The common collector connection node 94 of the transistors 48 and 52 is connected to the bases of the transistors 46 and 50. The common collector connection node 96 of the transistors 50 and 54 is connected to the bases of the transistors 44 and 48. The common collector connection node 92 of the transistors 42 and 46 is connected to an output terminal 98.

An operation of the conventional logic circuit, as shown in FIG. 1, will be explained in the following table.

TABLE 1

|  | I | II | III | IV |
| --- | --- | --- | --- | --- |
| Potential P10 on Input terminal 10 | L -> | H -> | L -> | L |
| Collector Potential P22 of Transistor 22 | L | H | L | H |
| Collector potential P12 of Transistor 12 | H | L | H | L |
| Potential P90 on Connection Node 90 | L | L | H | H |
| Potential P92 on Connection Node 92 | H | H | L | L |
| Potential P94 on Connection Node 94 | L | H | H | L |
| Potential P96 on Connection Node 96 | H | L | L | H |

As shown in Table 1, P10 indicates a potential on the input terminal 10 according to the input signal. P12 and P22 indicate potentials on the collectors of the transistors 12 and 22, respectively. P90, P92, P94 and P96 indicate potentials appearing on the common collector connection nodes 90, 92, 94 and 96 in the master-slave flip-flop 64 comprised of the transistors 42, 44, 46, 46, 50, 52, 54, 56, 58, 60 and 62. Further, symbols H and L in Table 1 denote high level and low level, respectively. For example, the potential P10 is the H level when a current does not flow through the resistor 18. While, the potential P10 is the L level when a current flows through the resistor 18.

Now it is assumed that the input signal applied to the input terminal 10 is initially the L level. Then, the level of the input signal alternately changes between the L level and the H level. Thus, the potential P10 on the base of the transistor 12 changes, as like L→H→L→H .... It is also assumed that initially the transistor 48 is turned ON while the transistor 50 is turned OFF. Thus, the potential P94 is the L level while the potential P82 is the H level. It follows that the potential P90 is put to the L level and the potential P92 is put to the H level, according to the nature of the second differential circuit 68. At this time, the transistor 12 is turned OFF while the transistor 22 is turned ON. The potential P12 becomes the H level and this H level potential appears directly at the emitter of the transistor 32. As a result, the transistors 58 and 60 are turned ON, and the transistors 56 and 62 are turned OFF. Accordingly, the current flow routes in the state I will be the route of the load resistor 82→the transistor 44→the transistor 58→the current source 78 and the route of the load resistor 86→the transistor 58→the transistor 60→the current source 80.

Then, when the signal P10 is changed to the H level (operation state II), the conduction states of the transistors 12 and 22 are reversed. Thus, the potential P12 is changed to the L level and the potential P22 is changed to the H level. Due to the changes of the potentials P12 and P22, the conduction states of the transistors 56, 58, 60 and 62 are also reversed. Then, the conduction states of the transistors 44 and 46 at the operation state I are latched by the transistors 40 and 42 of the second differential circuit 66. On the other hand, the transistors 48 and 50 are both turned OFF in the operation state II. The transistor 54 of the fifth differential circuit 72 is turned ON in response to the reverse operation of the seventh differential circuit 76. In this operation state II, currents flow through the route of the load resistor 82→the transistors 40→the transistor 56→the current source 78 and the route of the load resistor 88→the transistor 54→the transistor 62→the current source 80. As a result, the potentials P94 and P96 are reversed but the potentials P90 and P92 are not reversed at the change between the operation states I and II.

When the potential P10 again becomes the L level (operation state III), the transistors 32 is turned OFF and the transistor 12 is turned ON. As a result, the potential P22 is the L level and the potential P12 is the H level. The states of the sixth and seventh differential circuits 74 and 76 are reversed from the operation state II. As a result, the transistors 48 and 50 latch the states of the transistors 52 and 54. Thus, the transistor 50 is turned ON but the transistor 48 is turned OFF. The transistors 44 and 46 also latch the states of the transistors 40 and 42. Thus, the transistor 46 is turned ON but the transistor 44 is turned OFF. In this operation state III, currents flow through the route of the load resistor 84→the transistor 46→the transistor 58→the current source 78 and the route of the load resistor 88→the transistor 50→the transistor 60→the current source 80. As a result, the potentials P94 and P96 are not reversed but the potentials P90 and P92 are reversed at the change between the operation states II and III.

In the operation state IV, as the potential P10 changes to the H level again, the potential become the H level and the potential P12 becomes the L level. As a result, the sixth and seventh differential circuit 74 and 76 are reversed from the operation state III. As a result, the transistors 42 and 44 latch the states of the transistors 44 and 46. Thus, the transistor 42 is turned ON but the transistor 40 is turned OFF. The transistors 52 and 54 also latch the states of the transistors 48 and 50. Thus, the transistor 52 is turned ON but the transistor 54 is turned OFF. In this operation state IV, currents flow through the route of the load resistor 84→the transistor 42→the transistor 58→the current source 78 and the route of the load resistor 86→the transistor 52→the transistor 62→the current source 80. As a result, the potentials P94 and P96 are reversed but the potentials P90 and P92 are not reversed at the change between the operation states III and IV.

According to the operations described in the above, the logic circuit shown in FIG. 1 functions as a master-slave flip-flop which divides the frequency of the input signal into a half.

Recently, the logic circuit or the master-slave circuit have been used in many portable electronic equipments such as a remote control hand set, an IC card, etc. The portable equipments have required as battery as simple as possible. Generally, when a battery voltage drops below about 0.9 volts, the master-slave circuit cannot operate well. Therefore, provision of a logic circuit that is capable of performing the master-slave operation accurately at lower voltages is desirable.

The conventional circuit, as shown in FIG. 1, has a relatively long series route or connection in which two or more base-emitter junctions are included between power supply terminals. For example, the base-emitter junctions of the transistors 40 and 56 are connected in series between the power supply terminal 20 and the reference potential supply terminal 28. Each of the base-emitter junctions has a prescribed voltage, i.e., a so-called base-emitter junction voltage Vbe (minimum voltage required for ON/OFF operation of transistors). In silicon transistors, the base-emitter junction voltage Vbe are about 0.8 volts. Thus, logic circuits having such a series connection of the base-emitter junctions does not operate well at a voltage below 1.6 volts.

As described above, the conventional logic circuit has a problem in that the circuit does not operate unless the power source supplies a voltage about two times the base-emitter junction voltage Vbe.

SUMMARY OF THE INVENTION

An object of the present invention is to provide a low driving voltage operation logic circuit that eliminated the problem and operates at extremely low voltage, for instance, even when the available voltage from an ordinary battery drops quite low.

In order to achieve the above object, a low driving voltage operation logic circuit responsive to a power source voltage applied between a pair of power source terminals for modifying an input signal according to a predetermined logic pattern, includes an input control circuit having a plurality of input transistors for generating a pair of control signals, each having a level opposite to the other, in response to the input signal and a differential circuit having a plurality of paired transistors for dividing the frequency of the control signals, the input transistors each having an emitter area substantially larger than the emitter area of each paired transistor and the logic circuit including only a single base to emitter junction corresponding to each input transistor between the power source terminals.

Additional objects and advantages of the present invention will be apparent to person skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
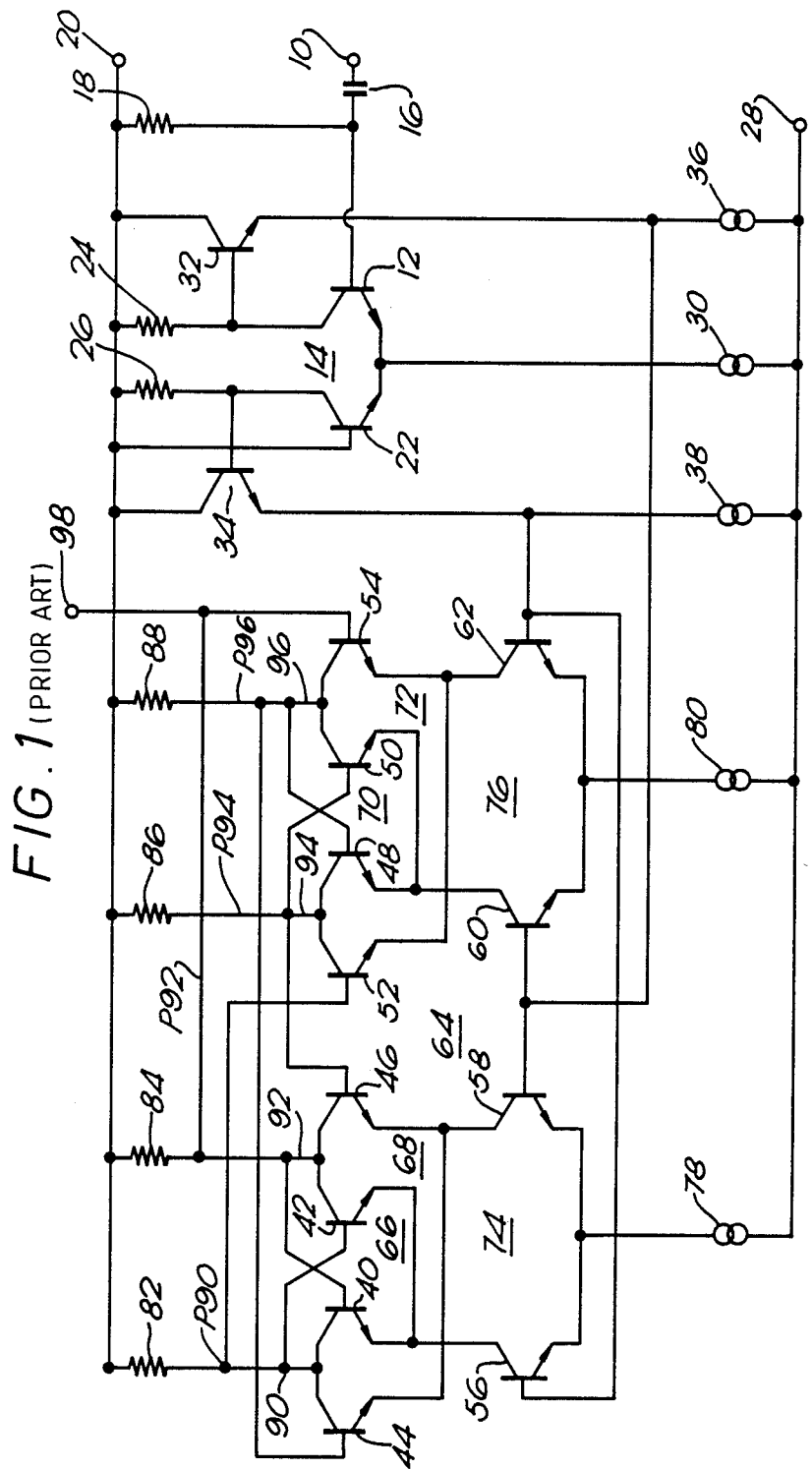
FIG. 1 is a circuit diagram showing the conventional logic circuit.

The low driving voltage operation logic circuit according to the present invention includes a master-slave flip-flop 64 that is a combination of differential circuit transistor circuit and a latch transistor circuit for latching the operating state of the differential circuit transistor circuit, a current source with prescribed paired devices of these transistor circuits, and an input stage transistor circuit having a larger emitter area than these paired devices for controlling the operation of the master-slave flip-flop 64 according to the operation of the input stage transistor circuit.

According to the construction described above, the ON/OFF operation of the circuit section combining the differential circuit performing the master-slave operation with the latch circuit is controlled by the input circuit transistors, the emitter areas of which are made wider than the emitter areas of the differential circuit transistors. In this case, as the emitter area ratio of the input circuit transistors to the differential circuit transistors is large, the ON/OFF operation can be definitely executed and it becomes unnecessary to provide a differential circuit for the lower portions of the latch circuit and the differential circuit. Thus, it becomes possible to construct a circuit containing no series connections of base-emitter junctions.

The present invention will now be described in detail with reference to the accompanying drawings, namely, FIGS. 2 through 7. Throughout the drawings, like reference numerals and letter are used to designate elements like or equivalent to those used in FIG. 1 for the sake of simplicity of explanation.

Figure 2:
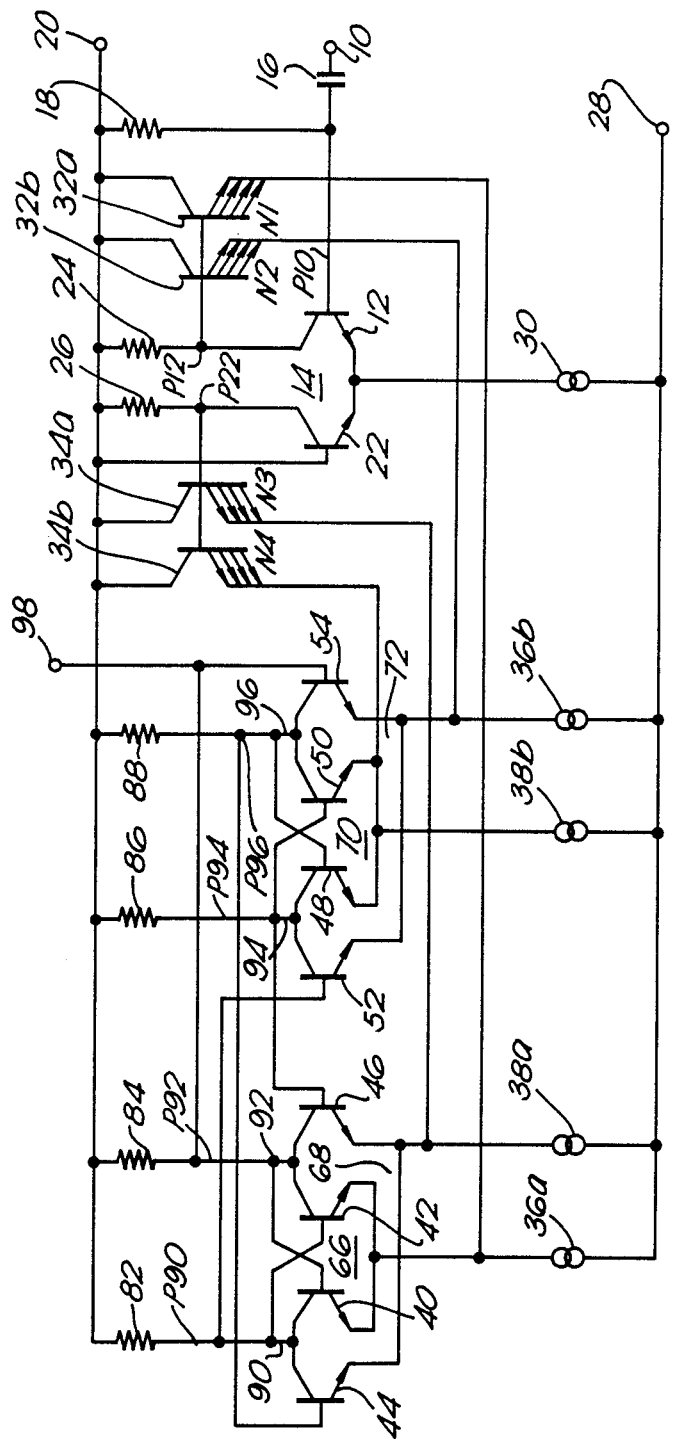
FIG. 2 is a circuit diagram showing a first embodiment of the low driving voltage operation logic circuit relative to the present invention.
Figure 3:
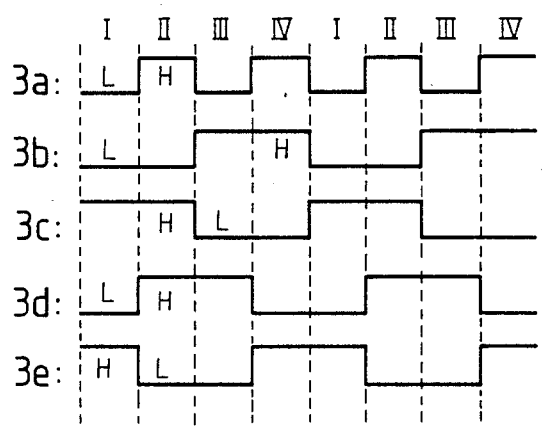
FIG. 3 is a theoretical waveform diagram for explaining the operation of the logic circuit of FIG. 2.

Referring now to FIG. 2, a first embodimetn of a low driving voltage operation master-slave flip-flop according to the present invention will be described in detail.

FIG. 2 is a circuit diagram showing the embodiment of the low driving voltage operation master-slave flip-flop.

In FIG. 2, an input signal which changes between two logic states, i.e., the H level and the L level is applied to an input terminal 10. This input signal is applied to the base of a transistor 12 of a first differential circuit 14 through a capacitor 16. A resistor 18 is connected between the base of the transistor 12 and a power supply terminal 20 with a source voltage Vcc. The first differential circuit 14 comprises the transistor 12 and a transistor 22, whose emitters are connected with each other.

Load resistors 24 and 26 are connected between the collectors of the transistors 12 and 22 and the power supply terminal 20, respectively. A connection node between the emitters of the transistors 12 and 22 is connected to a reference potential supply terminal 28 via a current source 30. Four transistors 32a, 32b, 34a and 34b are coupled in parallel between the power supply terminal 20 and the reference potential supply terminal 28 through current sources 36a, 36b, 38a and 38b, respectively. The bases of the transistors 32a and 32b are commonly connected to the collector of the transistor 12. The bases of the transistors 34a and 34b are connected to the collector of the transistor. Thus, the potential P12 of the collector of the transistor 12 is led to the bases of transistors 32a and 32b. The potential P22 on the collector of the transistor 12 is led to the bases of transistors 34a and 34b. Thus, currents supplied from current sources 36a, 36b, 38a and 38b to the transistors 32a, 32b, 34a and 34b are differentially controlled by the transistors 12 and 22.

Transistors 40, 42, 44, 46, 48, 50, 52 and 54 constitute a master-slave flip-flop 64 in a type of a double-balance type differential circuit. That is, the master-slave flip-flop 64 includes four differential circuits which are mutually connected as described below. In the master-slave flip-flop 64, the transistors 40 and 42 constitute a second differential circuit 66. The transistors 44 and 46 constitute a third differential circuit 68. The transistors 48 and 50 constitute a fourth differential circuit 70. The transistors 52 and 54 constitute a fifth differential circuit 72. That is, the emitters of the transistors 40 and 42 are connected in common and then the common emitter connection node thereof is coupled to the reference potential supply terminal 28 through the current source 36a. The emitters of the transistors 44 and 46 are connected in common and then the common emitter connection node thereof is coupled to the reference potential supply terminal 28 through the current source 38a. The emitters of the transistors 48 and 50 are connected in common and then the common emitter connection node thereof is coupled to the reference potential supply terminal 28 through the current source 38b. The emitters of the transistors 52 and 54 are connected in common and then the common emitter connection node thereof is coupled to the reference potential supply terminal 28 through the current source 36b.

The collectors of the transistors 40 and 44 are commonly connected to the power supply terminal 20 through a load resistor 82. The collectors of the transistors 42 and 46 are are commonly connected to the power supply terminal 20 through a load resistor 84. The collectors of the transistors 48 and 52 are commonly connector to the power supply terminal 20 through a load resistor 86. The collectors of the transistors 50 and 54 are commonly connected to the power supply terminal 20 through a load resistor 88.

The common collector connection node 90 of the transistors 40 and 44 is connected to the bases of the transistors 42 and 52. The common collector connection node 92 of the transistors 42 and 46 is connected to the bases of the transistors 40 and 54. The common collector connection node 94 of the transistors 48 and 52 is connected to the bases of the transistors 46 and 50. The common collector connection node 96 of the transistors 50 and 54 is connected to the base of the transistors 44 and 48. The common collector connection node 92 of the transistors 42 and 46 is connected to an output terminal 98.

Here, the transistors 32a, 32b, 34a and 34b have emitter areas much larger than those of the transistors 40, 42, 44, 46, 48, 50, 52 and 54. The emitter area ratio of the transistor 32a to the transistors 40 and 42 of the second differential circuit 66 is set at N1:1. The emitter area ratio of the transistor 32b to the transistors 52 and 54 of the fifth differential circuit 62 is set at N2:1. The emitter area ratio of the transistor 34a to the transistors 44 and 46 of the third differential circuit 68 is set at N3:1. The emitter area ratio of the transistor 34b to the transistors 48 and 50 of the fourth differential circuit 70 is set at N4:1. The ratios N1 through N4 are much larger than one (N1, N2, N3, N4>>>1), e.g., as high as 10 or more.

The operation of the logic circuit will be described hereinafter. Further, the symbols assigned to the signals at parts of the circuit shown in FIG. 1 will also be used for the same signals appearing in this circuit.

First, when the potential P10 of the input signal is at the L level, the transistor 12 is turned OFF and the transistor 22 is turned ON. Therefore, the potential P22 on the collector of the transistor 22 becomes the L level and the potential P12 on the collector of the transistor 12 becomes the H level. According to the H Level of the potential P12 at the time, the transistors 32a and 32b are both turned ON. Now the emitter area ratios of the transistors 32a and 32b are set sufficiently larger than those of the transistors 40, 42, 52 and 54, currents supplied from the current sources 36a and 36b almost flow through the transistors 32a and 32b. For example, assuming that the emitter area of the transistor 32a is ten times larger than the emitter areas of each of the transistors 40 and 42, ten to eleven (10/11) times of the current of the current source 36a will flow through the transistor 32a. As a result, the transistors 40 and 42 are biased in the nearly cut-off state.

Therefore, in the operating state I corresponding to the L level state of the input signal, the transistors 40, 42, 52 and 54 are turned OFF. Likewise, in the operating state III corresponding to the other L level state of the input signal after changing, the transistors 44, 46, 48 and 50 are turned OFF.

When the potential P10 of the input signal becomes the H level (operating state II), the transistors 32a and 32b are turn OFF, but the transistors 34a and 34b are turned ON.

Since the emitter area of each of the transistors 34a and 34b is sufficiently larger than the emitter areas of each of the transistors 44, 46, 48 and 50, currents supplied from the current sources 38a and 38b almost all flow through the transistors 34a and 34b. Therefore, in this operating state II corresponding to the H Level state of the input signal after changing from the L Level, the transistors 44, 46, 48 and 50 are turned OFF. Likewise, in the operating state IV corresponding to the other H Level state of the input signal after changing from the other L Level, the transistors 44, 46, 48 and 50 are turned OFF.

Thus, the flip-flop operation is carried out in the master-slave flip-flop 64. Hereinafter, the flip-flop operation will be explained for each of the operating states I, II, III and IV. Now, it is assumed that the potential P10 of the input signal changes, as shown by a graph 3a i FIG. 3. Then, the potentials P90, P92, and P96 on the common collector connection nodes 90, 92, 94 and 96 change, as shown by graphs 3b, 3c, 3d and 3e in FIG. 3.

[Operating State I]

In the operating state I, the transistors 42, 44, 52 and 54 are turned OFF as described above. Here, it is assumed that the potential P10 of the input signal is the L level and the transistor 48 is turned ON at the initial state after the power source has been turned ON, likewise in FIG. 1. The transistor 44 is turned on, but the transistor 46 is turned OFF according to the differential operation of the third differential circuit 68. Thus, currents flow through the route of the load resistor 82→ the transistor 44→ the current source 38a and the route of the load resistor 86→ the transistor 48→ the current source 38b. Therefore, the potential P90 changes to the L level. The potential P92 changes to the H level. The potential P94 changes to the L level, and the potential P96 changes to the H level.

[Operating State II]

In this operating state II, the transistors 44, 46, 48 and 50 are turned OFF due to the differences of the emitter areas. As the transistor 44 was turned ON but the transistor 46 was turned OFF in the operating state I, the transistor 40 is here turned ON but the transistor 42 is turned OFF (latch operation). As a result, the potential P90 is held at the L level and the potential P92 is held at the H level in this operation change between the states I and II. The transistor 52 is turned OFF by the L level state of the potential P90 but the transistor 54 is turned ON by the H level state of the potential P92. Thus, currents flow through the route of the load resistor 82→the transistor 40→the current source 36a and the route of the load resistor 88→the transistor 54→the current source 36b. Therefore, the potential P90 changes to the L level. The potential P92 changes to the H level. As a result, the potential P94 changes to the H level and the potential P96 changes to the L level.

[Operating State III]

In the operating state III, the transistors 32a and 32b are again turned ON. Thus, the currents of the current sources 36a and 36b flow through the transistors 32a and 32b. In this state, the transistors 40, 42, 52 and 54 are turned OFF. As the transistors 48 and 50 latch the states of the transistors 52 and 54 in the operating state II, the transistor 50 is turned ON but the transistor 48 is turned OFF. As a result, the potential P94 is held at the H level and the potential P96 is held at the L level in this operation change between the states II and III. Further, the transistor 46 is turned ON by the H level state of the potential P94, and the transistor 44 is turned OFF by the L level state of the potential P96. Thus, currents flow through the route of the load resistor 84→the transistor 46→the current source 38a and the route of the load resistor 88→the transistor 50→the current source 38b. As a result, the potential P90 changes to the H level and the potential P92 changes to the L level.

[Operating State IV]

In the operating state IV, the transistors 44, 46, 48 and 50 are turned OFF. As the transistor 46 was turned ON and the transistor 44 was turned OFF in the operating state III, the transistor 42 is turned ON but the transistor 40 is turned OFF. As a result, the potential P90 is held at the H level and the potential P82 is held at the L level. Further, the transistor 52 is turned ON by the H level state of the potential P90 and the transistor 54 is turned OFF by the L level state of the potential P92. Thus, currents flow through the route of the load resistor 84→the transistor 42→the current source 36a and the route of the load resistor 86→the transistor 52→the current source 36b. Therefore, the potential P94 changes to the L level and the potential P96 changes to the H level.

Table 2 shown below illustrates the ON/OFF operations of the transistors 40, 42, 44, 46, 48, 50, 52 and 54 of the second, third, fourth and fifth differential circuits 66, 68, 70 and 72.

TABLE 2

|  | I | II | III | IV |
|---|---|---|---|---|
| Transistor 40 | OFF | ON | OFF | OFF |
| Transistor 42 | OFF | OFF | OFF | ON |
| Transistor 44 | ON | OFF | OFF | OFF |
| Transistor 46 | OFF | OFF | ON | OFF |
| Transistor 48 | ON | OFF | OFF | OFF |
| Transistor 50 | OFF | OFF | ON | OFF |
| Transistor 52 | OFF | OFF | OFF | ON |
| Transistor 54 | OFF | ON | OFF | OFF |

As shown in Table 2, the embodiment of the logic circuit or the master-slave flip-flop performs the same master-slave flip-flop operation as in the circuit shown in FIG. 1. When compared with the circuit of FIG. 1, all of current paths between the power supply terminal 20 and the reference potential supply terminal 28 include only a single base-emitter junction of transistors. Thus, the flip-flop operation can be performed at a power source voltage lower than the voltage of the circuit of FIG. 1. For example, the circuit of the embodiment can operate at the voltage about 0.9 volts.

Figure 4:
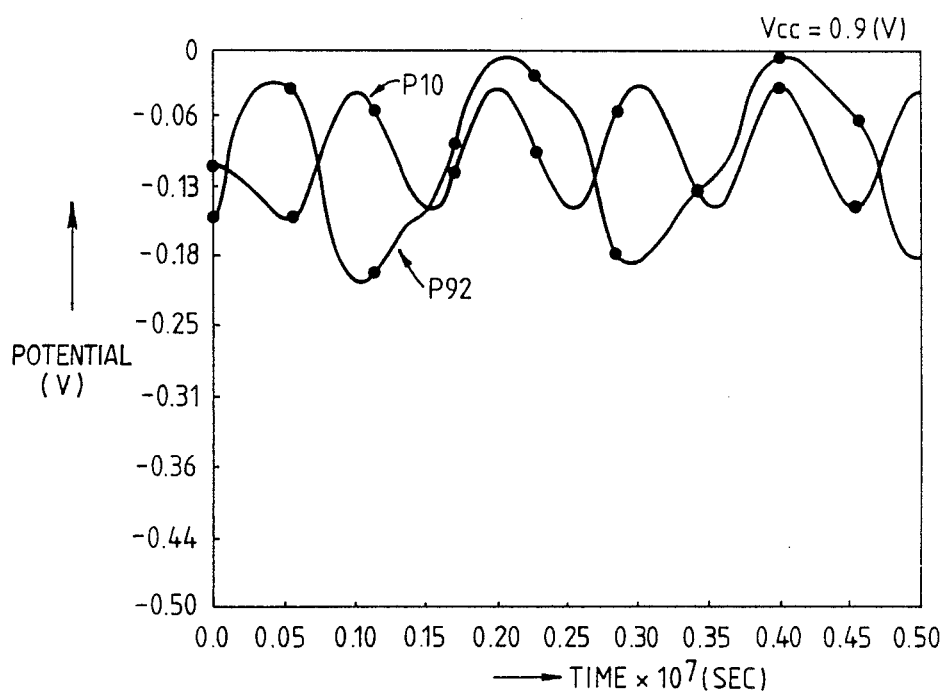
FIG. 4 is a waveform diagram for explaining the operation of the present invention.

FIG. 4 shows the master-slave flip-flop operation of the embodiment at the power source voltage Vcc of 0.9 volts. In FIG. 4, Graph 4a illustrates the potential P10 or the input signal and Graph 4b illustrates the potential P92, i.e., the output signal. It can be seen from FIG. 4 that the output signal changes in the frequency a half of the input signal. Thus, the frequency dividing operation is performed.

Figure 5:
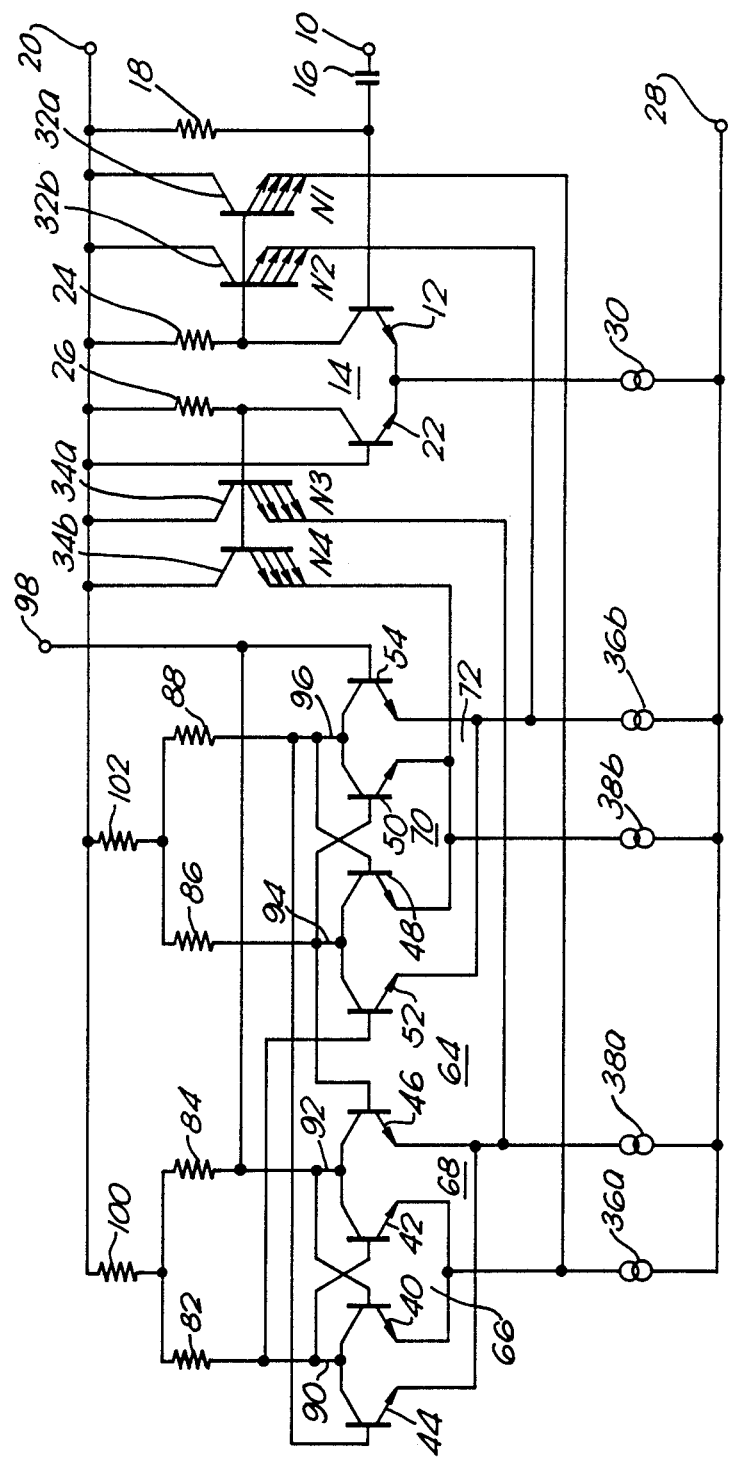
FIG. 5 is a circuit diagram showing a second embodiment of the logic circuit according to the present invention.

Referring now to FIG. 5, a second embodiment of the logic circuit according to the present invention will be described. The second embodiment of the logic circuit ensures the ON/OFF operations of the transistors 40, 42, 44, 46, 48, 50, 52 and 54 of the second, third, fourth and fifth differential circuits 66, 68, 70 and 72.

In FIG. 5, the load resistors 82 and 84 are connected to the power supply terminal 20 through a voltage reduction resistor 100. Also, the load resistors 86 and 88 are connected to the power supply terminal 20 through a voltage reduction resistor 102. Other portions of the circuit are the same as the above embodiment, as shown in FIG. 2.

In FIG. 5, the voltage reduction resistors 100 and 102 decrease the power source voltages supplied to the second to fifth differential circuits 66, 68, 70 and 72 lower than the voltage supplied to the transistors 32a, 32b, 34a and 34b. Thus, currents flowing through the transistors 40, 42, 44, 46, 48, 50, 52 and 54 further decrease in comparison to the above embodiment. By reducing the power source voltage for driving, the transistors 40, 42, 44, 46, 48, 50, 52 and 54 are much biased to the OFF state, in comparison to the ON state of the transistors 32a, 32b, 34a and 34b. Thus, the master-slave flip-flop operation of the circuit is assured.

Figure 6:
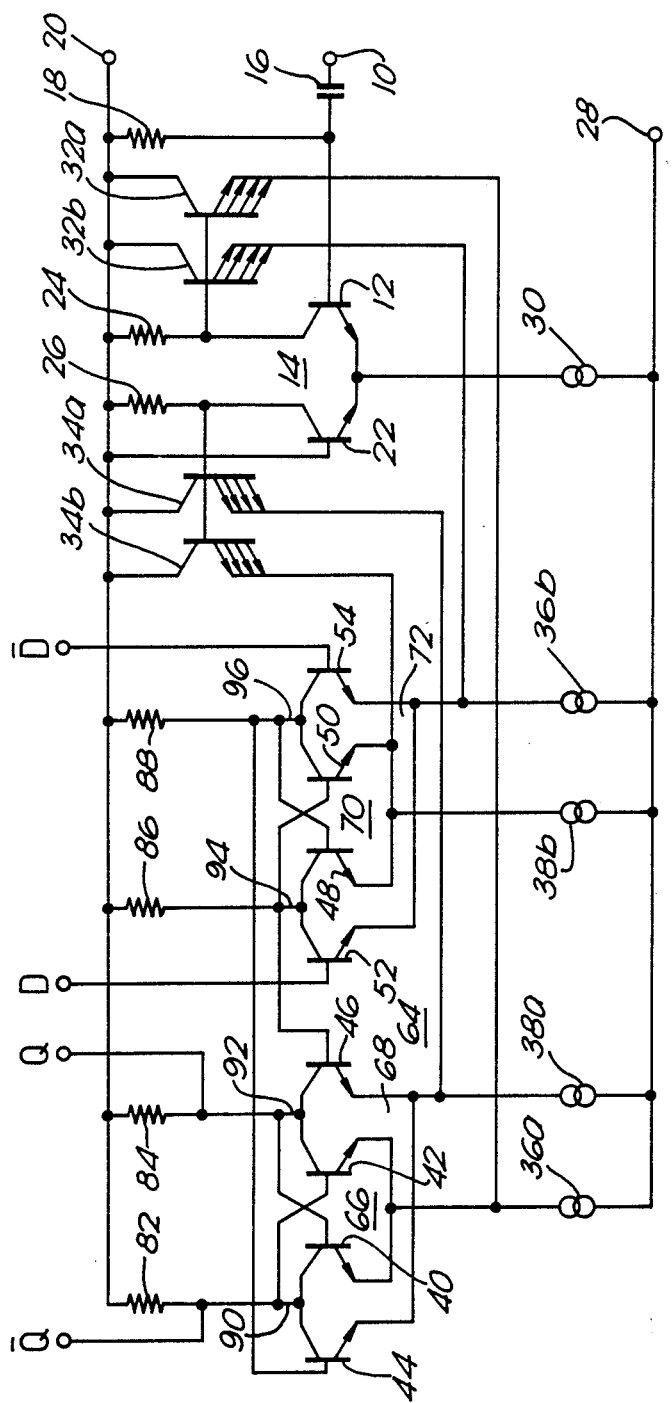
FIG. 6 is a circuit diagram showing a third embodiment of the logic circuit according to the present invention.

Referring now to FIG. 6, a third embodiment of the logic circuit according to the present invention will be described. This third embodiment of the logic circuit is a circuit with required terminals arranged so that it can be used as a D-type flip-flop circuit. The circuit elements are assigned the same references as those shown in FIG. 2. The $\overline{Q}$ terminal is connected to the common collector connection node 90 of the transistors 44 and 40. The Q terminal is connected to the common collector connection node 92 of the transistors 42 and 46. The $\overline{D}$-input terminal is connected to the base of the transistor 52. The D-input terminal is connected to the base of the transistor 54. The base of the transistor 52 and the common collector connection node 90 of the transistors 40 and 44 are separated. Also, the base of the transistor 54 and the common collector connection node 92 of the transistors 42 and 46 are separated. A clock signal is applied to the input terminal 10 as the input signal.

Figure 7:
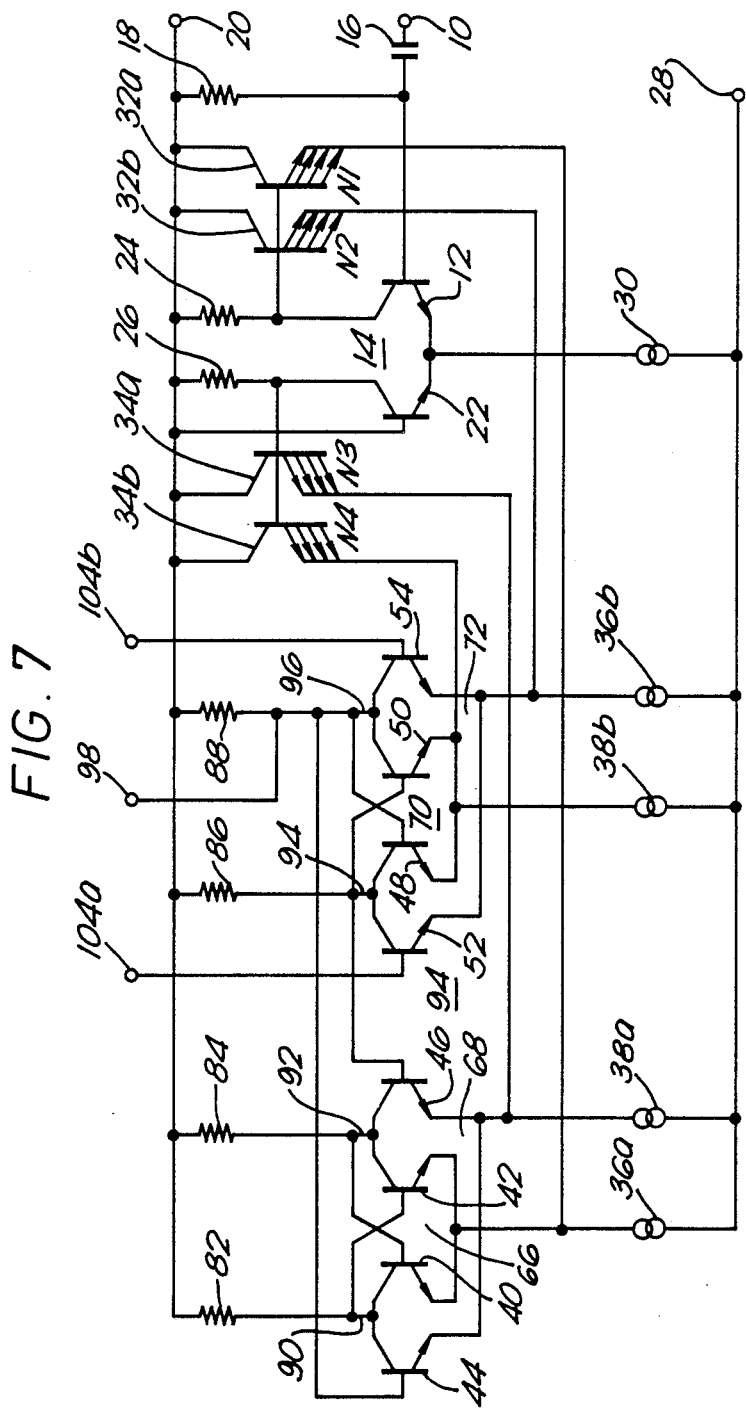
FIG. 7 is a circuit diagram showing a fourth embodiment of the logic circuit according to the present invention.

Referring now to FIG. 7, a fourth embodiment of the logic circuit according to the present invention will be described. This fourth embodiment of the logic circuit provides a latch circuit. The circuit elements are assigned the same references as those shown in FIG. 2. In FIG. 7, the bases of the transistors 52 and 54 of the fifth differential circuit 72 are connected to opposite phase input terminals 104a and 1-4b for receiving an input signal to be latched. The bases of the transistors 52 and 54 are separated from the common collector connection nodes 90 and 92. The common collector connection node 96 is connected to a latch output terminal 98a. The base of the transistor 12 is coupled to a clock signal input terminal 10a. Other portions of the circuit are the same as the above embodiment, as shown in FIG. 2.

According to the latch circuit, as shown in FIG. 7, the input signal applied to the latch input terminal 104a and 104b is latched at the timing of the leading edge of the clock signal.

In the embodiments, as shown in FIGS. 2, 5, 6 and 7, the logic operation, such as the flip-flop operation can be made more accurate by making the emitter area N2 of the transistor 32b larger than the emitter area N4 of the transistor 34b, and the emitter area N3 of the transistor 34a larger than the emitter area N1 of the transistor 32a, that is, N2>N4 and N3>N1. Further, it has been confirmed that this circuit operates stably even in the high frequency range.

As described above, the present invention can provide an extremely preferable logic circuit.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A low driving voltage operation logic circuit responsive to a power source voltage applied between a pair of power source terminals for modifying an input signal according to a predetermined logic pattern, comprising:

input control means including a plurality of input transistors, for generating a pair of control signals, each having a level opposite to the other, in response to the input signal; and differential means including a plurality of paired transistors for dividing the frequency of the control signals, the input transistors each having an emitter area substantially larger than the emitter area of each paired transistor, and the logic circuit including only a single base to emitter junction corresponding to each input transistor between the power source terminals.

2. The logic circuit of claim 1 also including power reducing means connected between one of the power source terminals and the differential means for supplying an operating voltage lower than the power source voltage to the input control means.

3. The logic circuit of claim 1 wherein the differential means comprises a D-type flip-flop circuit.

4. The logic circuit of claim 1 wherein the differential means includes a master-slave type flip-flop circuit.

5. The logic circuit of claim 1 wherein each input transistor corresponds to a pair of the paired transistors, and the respective ratios of the emitter areas of each input transistor of the corresponding pair of paired transistors are unequal.

6. The logic circuit of claim 1 wherein each of the differential means and the input control means includes at least one current source.

* * * * *